(12) United States Patent
Huang et al.

(10) Patent No.: US 8,486,299 B2
(45) Date of Patent: Jul. 16, 2013

(54) BLUE PHOSPHORS, WHITE LIGHT ILLUMINATION DEVICES AND SOLAR CELLS UTILIZING THE SAME

(75) Inventors: Tien-Heng Huang, Yongkang (TW); Fang-Ching Chang, Yongkang (TW); Yao-Tsung Yeh, Taoyuan (TW); Shian-Jy Wang, Hsinchu County (TW)

(73) Assignee: Industrial Technology Research Institute, Hsinchu County (TW)

( * ) Notice: Subject to any disclaimer, the term of this patent is extended or adjusted under 35 U.S.C. 154(b) by 263 days.

(21) Appl. No.: 12/840,295

(22) Filed: Jul. 21, 2010

(65) Prior Publication Data

US 2011/0226314 A1  Sep. 22, 2011

(30) Foreign Application Priority Data

Mar. 18, 2010 (TW) .............................. 99107937 A

(51) Int. Cl.
C09K 11/80  (2006.01)
(52) U.S. Cl.
USPC ................... 252/301.4 R; 313/486; 313/487; 136/257
(58) Field of Classification Search
USPC ............. 252/301.4 R; 313/486, 487; 136/257
See application file for complete search history.

(56) References Cited

U.S. PATENT DOCUMENTS

| | | | |
|---|---|---|---|
| 6,166,491 A * | 12/2000 | Tsuchiya et al. ............ 315/169.3 |
| 6,252,254 B1 | 6/2001 | Soules et al. |
| 6,466,135 B1 | 10/2002 | Srivastava et al. |
| 6,580,097 B1 | 6/2003 | Soules et al. |
| 6,685,852 B2 | 2/2004 | Setlur et al. |
| 6,777,879 B2 * | 8/2004 | Juestel et al. ..................... 315/59 |
| 6,960,309 B2 * | 11/2005 | Aoki et al. ............. 252/301.4 R |
| 7,064,480 B2 | 6/2006 | Bokor et al. |
| 7,239,082 B2 | 7/2007 | Bokor et al. |
| 2002/0041156 A1 * | 4/2002 | Juestel et al. ................. 313/586 |
| 2004/0056256 A1 | 3/2004 | Bokor et al. |
| 2006/0055315 A1 | 3/2006 | Bokor et al. |
| 2006/0238101 A1 | 10/2006 | Choi et al. |
| 2007/0170842 A1 | 7/2007 | Bokor et al. |
| 2008/0203893 A1 | 8/2008 | Sakai et al. |

FOREIGN PATENT DOCUMENTS

CN  1326907 A  12/2001

(Continued)

OTHER PUBLICATIONS

Hintzen et al., "On the Existence of Europium Aluminum Oxynitrides with a Magnetoplumbite or beta-Alumina Type Structure", Journal of Solid State Chemistry 142, 48-50 (1999).

Office Action (Notification of Examination Opinion) issued by the Taiwan Intellectual Property Office on Mar. 26, 2013, for the above-referenced application's counterpart application in Taiwan (Application No. 099107937).

Primary Examiner — Carol M Koslow
(74) Attorney, Agent, or Firm — Pai Patent & Trademark Law Firm; Chao-Chang David Pai

(57) ABSTRACT

The invention provides phosphors composed of $Eu_{(1-x-w)}Ma_xMb_wMgMc_{10}O_{17}$, wherein Ma is Yb, Sn, Ce, Tb, Dy, or combinations thereof, and $0<x<0.5$, Mb is Ca, Sr, Ba, or combinations thereof, and $0 \leq w \leq 0.5$, and Mc is Al, Ga, Sc, In, or combinations thereof. The blue phosphors emit blue light under the excitation of ultraviolet light or blue light, and the phosphors may be further collocated with different colored phosphors to provide a white light illumination device. The blue phosphors of the invention can efficiently utilize light in solar cells.

6 Claims, 7 Drawing Sheets

FOREIGN PATENT DOCUMENTS

| | | | |
|---|---|---|---|
| CN | 101397497 | * | 4/2009 |
| EP | 1506988 A1 | | 2/2005 |
| JP | 2004-224830 A | | 8/2004 |
| TW | 200945604 A | | 11/2009 |
| TW | 200951343 A1 | | 12/2009 |
| WO | 0211214 A1 | | 2/2002 |

* cited by examiner

BLUE PHOSPHORS, WHITE LIGHT ILLUMINATION DEVICES AND SOLAR CELLS UTILIZING THE SAME

CROSS REFERENCE TO RELATED APPLICATIONS

This application claims priority of Taiwan Patent Application No. 099107937, filed on Mar. 18, 2010, the entirety of which is incorporated by reference herein.

BACKGROUND OF THE INVENTION

1. Field of the Invention

The present invention relates to phosphors, and in particular, relates to a white light illumination device and solar cells utilizing the same.

2. Description of the Related Art

Use of white light emitting diodes (LED) is a new trend in the modern illumination industry due to its energy-saving, low pollution, and long lifetime characteristics. For luminous efficiency of illumination devices, in addition to inherent brightness of LEDs, LED phosphors are also important.

A common commercially available white light LED, uses a blue LED (emission wavelength of 460 nm to 480 nm) collocating with a yellow phosphor, which has poor color-rendering, such that a yellow light may be emitted. Namely, because the intensity of the blue light changes with different input currents, the white light will tend to be yellowish or blueish. Furthermore, because the blue LED chips wear out gradually over time, the white light color may be uneven. To improve color-rendering and luminous efficiency, a UV light emitting diode may be adopted with red, blue, and green phosphors. Because the light source is a UV light, the white light color is not influenced by decreased intensity thereof.

In U.S. Pat. Nos. 7,064,480 and 7,239,082 and World Pat. No. 0211214, a blue-green phosphor aluminate $EuMgAl_{10}O_{17}$ is disclosed. A phosphor is excited by a major excitation peak of 396 nm to emit a blue-green light having a major emission peak of 477 nm. However, the maximum emission intensity of the phosphor is poor.

Accordingly, the phosphor composition must be tuned to enhance maximum emission intensity. Moreover, emission wavelength of the phosphor must be close to pure blue.

BRIEF SUMMARY OF THE INVENTION

The invention provides a blue phosphor, having a formula: $Eu_{(1-x-w)}Ma_xMb_wMgMc_{10}O_{17}$, wherein Ma is Yb, Sn, Ce, Tb, Dy, or combinations thereof, and $0<x<0.5$; Mb is Ca, Sr, Ba, or combinations thereof, and $0 \leq w \leq 0.5$, and Mc is Al, Ga, Sc, In, or combinations thereof.

The invention also provides a white light illumination device, comprising the described blue phosphor and an excitation light source, wherein the excitation light source emits 200-400 nm UV or 400-420 nm blue light.

The invention further provides a solar cell, comprising: a transparent substrate; an anode and a cathode on the bottom surface of the transparent substrate; and a semiconductor layer between the anode and the cathode, wherein the top surface of the transparent substrate has the previously described blue phosphor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
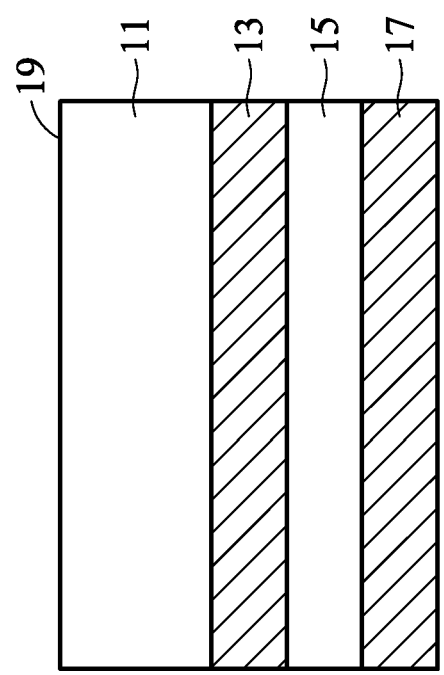
FIG. 1 shows the solar cell in one embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The invention provides a blue phosphor having a formula: $Eu_{(1-x-w)}Ma_xMb_wMgMc_{10}O_{17}$, wherein Ma is Yb, Sn, Ce, Tb, Dy, or combinations thereof, and $0<x<0.5$; Mb is Ca, Sr, Ba or combinations thereof, and $0 \leq w \leq 0.5$; and Mc is Al, Ga, Sc, In, or combinations thereof. In one embodiment, the blue phosphor is $Eu_{(1-x)}Yb_xMgAl_{10}O_{17}$. In another embodiment, the blue phosphor is $Eu_{(1-x)}Dy_xMgAl_{10}O_{17}$. In a further embodiment, the blue phosphor is $Eu_{(1-x)}Ce_xMgAl_{10}O_{17}$.

The blue phosphor can be excited by 200-400 nm UV or 400-420 nm blue light to emit a blue light. The blue light has a major emission peak of about 476 nm, and the major emission peak has a CIE coordinate of (0.172, 0.297) The excitation light source applied to emit UV or blue light includes a light emitting diode or a laser diode.

The method for preparing the described phosphor is through a solid-reaction. First, an appropriate stoichiometry of reagents is weighted according to the element molar ratio of a resulting phosphor: $Eu_{(1-x-w)}Ma_xMb_wMgMc_{10}O_{17}$, wherein Ma is Yb, Sn, Ce, Tb, Dy, or combinations thereof, Mb is Ca, Sr, Ba, or combinations thereof, and Mc is Al, Ga, Sc, In, or combinations thereof. The reagents containing Eu, Yb, Sn, Ce, Tb, Dy can be chlorides such as $EuCl_2$ or nitrate such as $Tb(NO_3)_3$. The reagents containing Ca, Sr, or Ba can be oxides such as CaO, carbonates such as $CaCO_3$, or chlorides such as $CaCl_2$. The reagents containing Mg can be oxides such as MgO, carbonates such as $MgCO_3$, or chlorides such as $MgCl_2$. The reagents containing Al, Ga, Sc, or In can be oxides such as $\gamma$-$Al_2O_3$, $Ga_2O_3$, or $In_2O_3$. The described appropriate equivalent reagents are evenly mixed and grinded, and charged in a crucible. The crucible is then heated in a high temperature furnace. After sintering at 1400-1700° C. for several hours, the described phosphor is prepared.

In one embodiment, the blue phosphor of the invention may collocate with a UV or blue light excitable yellow phosphor, to complete formation of a white light emitting diode or white laser diode, following arrangement with an ultraviolet excitation light source such as a light-emitting diode or laser diode. The described yellow phosphor includes $Y_3Al_5O_{12}$:$Ce^{3+}$ (YAG), $Tb_3Al_5O_{12}$:$Ce^{3+}$ (TAG), (Mg, Ca, Sr, Ba)$_2SiO_4$:$Eu^{2+}$, and other suitable yellow phosphors. If the yellow phosphor is UV excitable, the yellow phosphor is directly excited by an excitation light source such as a light emitting diode or a laser diode. If the yellow phosphor is blue light excitable, the yellow phosphor is indirectly excited by blue light. The blue light is emitted from the blue phosphor excited by an excitation light source such as a light emitting diode or a laser diode. The combination and ratio of blue and yellow phosphors are optional in different applications of direct or indirect excitation.

In addition, the blue phosphor of the invention may collocate with UV or blue light excitable red and green phosphors to improve color rendering, to complete formation of a white light emitting diode or white laser diode, following arrangement with an ultraviolet excitation light source such as a light-emitting diode or laser diode. The red phosphor includes (Sr, Ca)S:$Eu^{2+}$, (Y, La, Gd, Lu)$_2O_3$:($Eu^{3+}$, $Bi^{3+}$), (Y, La, Gd, Lu)$_2O_2S$:($Eu^{3+}$, $Bi^{3+}$), $Ca_2Si_5N_8$:$Eu^{2+}$, ZnCdS:AgCl, or other suitable red phosphors. The green phosphor includes $BaMgAl_{10}O_{17}$:($Eu^{2+}$,$Mn^{2+}$), $SrGa_2S_4$:$Eu^{2+}$, (Ca, Sr, Ba)$Al_2O_4$:($Eu^{2+}$, $Mn^{2+}$), (Ca, Sr, Ba)$_4Al_{14}O_{25}$:$Eu^{2+}$, or $Ca_8Mg(SiO_4)_4Cl_2$:($Eu^{2+}$, $Mn^{2+}$), or other suitable green phosphors. Similar to yellow phosphor, the red and green phosphor can be divided into directly or indirectly excitable. If the red or green phosphor is UV excitable, the red or green phosphor is directly excited by an excitation light source such as a light emitting diode or a laser diode. If the red or green phosphor is blue light excitable, the red or green phosphor is indirectly excited by blue light. The blue light is emitted from the blue phosphor excited by an excitation light source such as a light emitting diode or laser diode. The combination and ratio of red, green, and blue phosphors are optional in different applications of direct or indirect excitation.

When fabricating the white light illumination devices, such as the described white light emitting diode or white laser diode, the blue/yellow or red/green/blue phosphors can be evenly mixed in a preferable ratio and dispersed in an optical gel. The optical gel containing the phosphors may further seal a UV excitation light source such as a chip of a light emitting diode or a laser diode. Note that if a UV light is selected as the excitation light source, a UV filter or other UV insulator should be arranged externally from the white light illumination device to protect a user's eyes and skin.

In addition to the white light emitting diode, the UV excitable phosphor of the invention can be applied to a solar cell. As shown in FIG. 1, a typical solar cell includes a transparent substrate 11. An anode 13, a semiconductor layer 15, and a cathode 17 are sequentially formed on the transparent substrate 11. In general, the transparent substrate 11 is glass, plastic, or synthetic resin. The anode 13 is a transparent conductive layer such as indium tin oxide (ITO), zinc oxide, tin fluoride oxide, or combinations thereof. The semiconductor layer 15 can be single or multi-layered PIN structure including a p-type doped (so called P layer), non-doped (so-called I layer), and n-type doped (so-called N layer) semiconductor material. The semiconductor material can be hydrogenated amorphous silicon or hydrogenated microcrystalline silicon. The cathode 17 is aluminum, silver, molybdenum, platinum, copper, gold, iron, niobium, titanium, chromium, bismuth, antimony, and the likes. Most of the semiconductor layers utilize visible light other than higher energy UV. The phosphor of the invention can be formed on a top surface 19 of the transparent substrate 11, thereby transforming UV light to visible blue light to enhance the light efficient utilization of the semiconductor layer 15 in the solar cell.

EXAMPLES

Example 1

Figure 2:
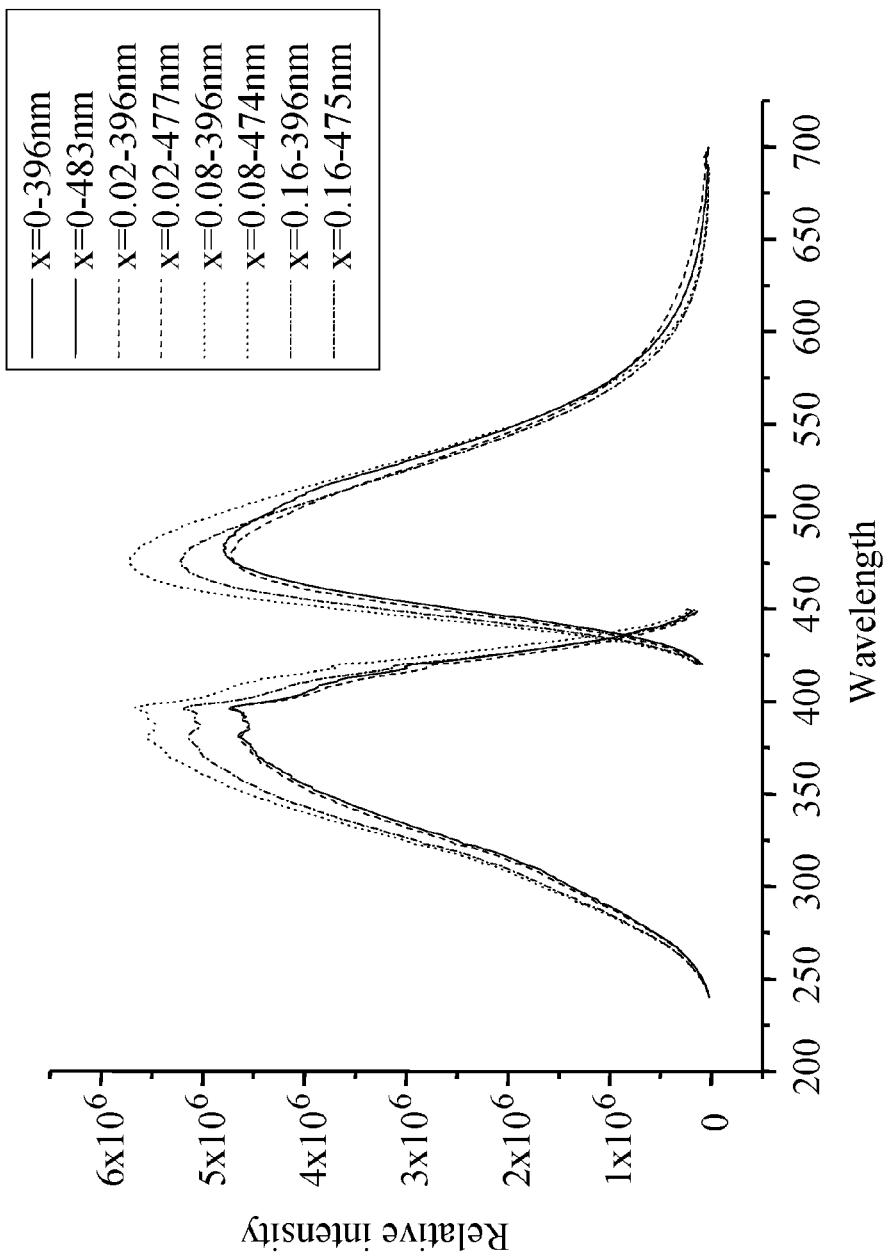
FIG. 2 shows a comparison between an excitation and emission spectra of the phosphors $Eu_{1-x}Ab_xMgAl_{10}O_{17}$ with different x ratios in one embodiment of the invention and a conventional phosphor $EuMgAl_{10}O_{17}$.
Figure 3:
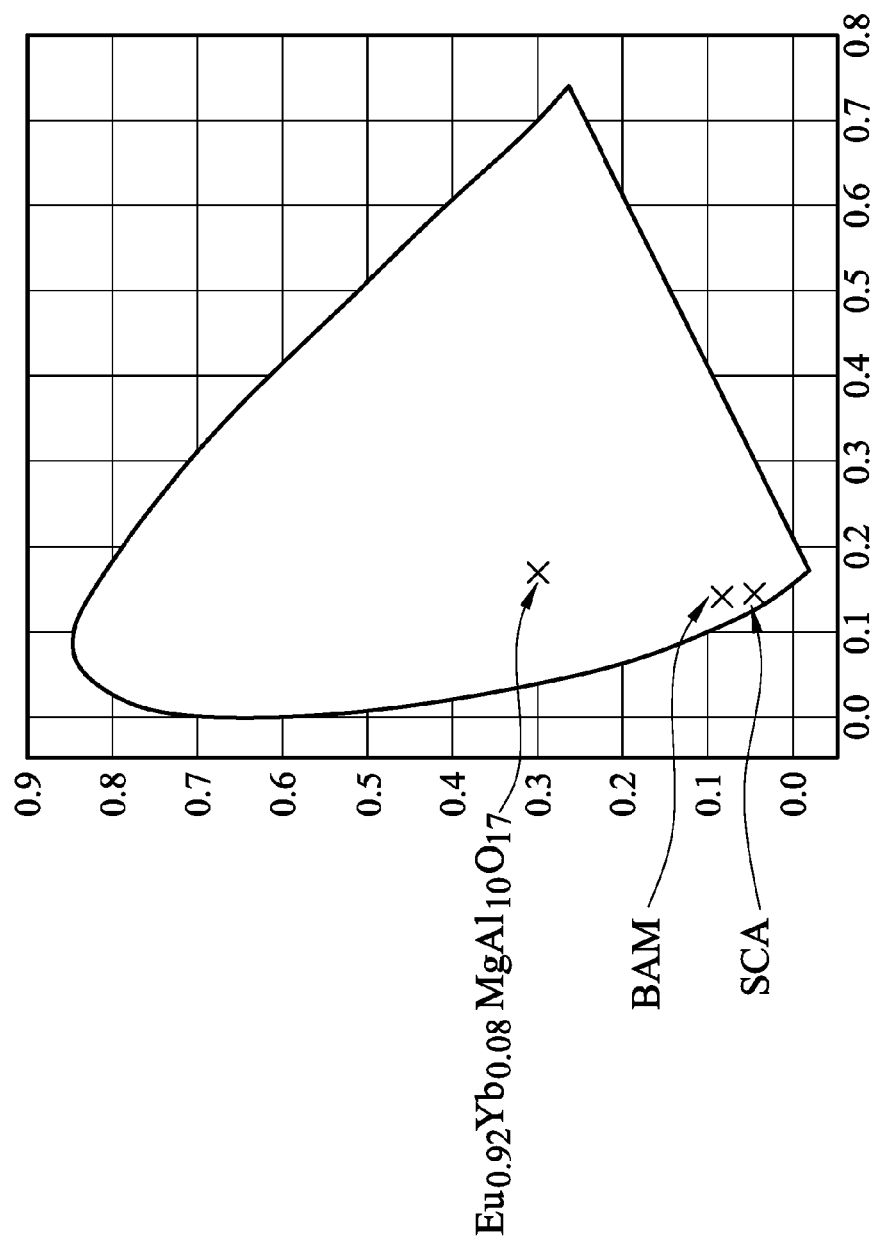
FIG. 3 shows CIE coordinates of a phosphor $Eu_{0.2}Yb_{0.8}MgAl_{10}O_{17}$ in one embodiment of the invention, a commercially available product BAM, and a commercially available product SCA.
Figure 4:
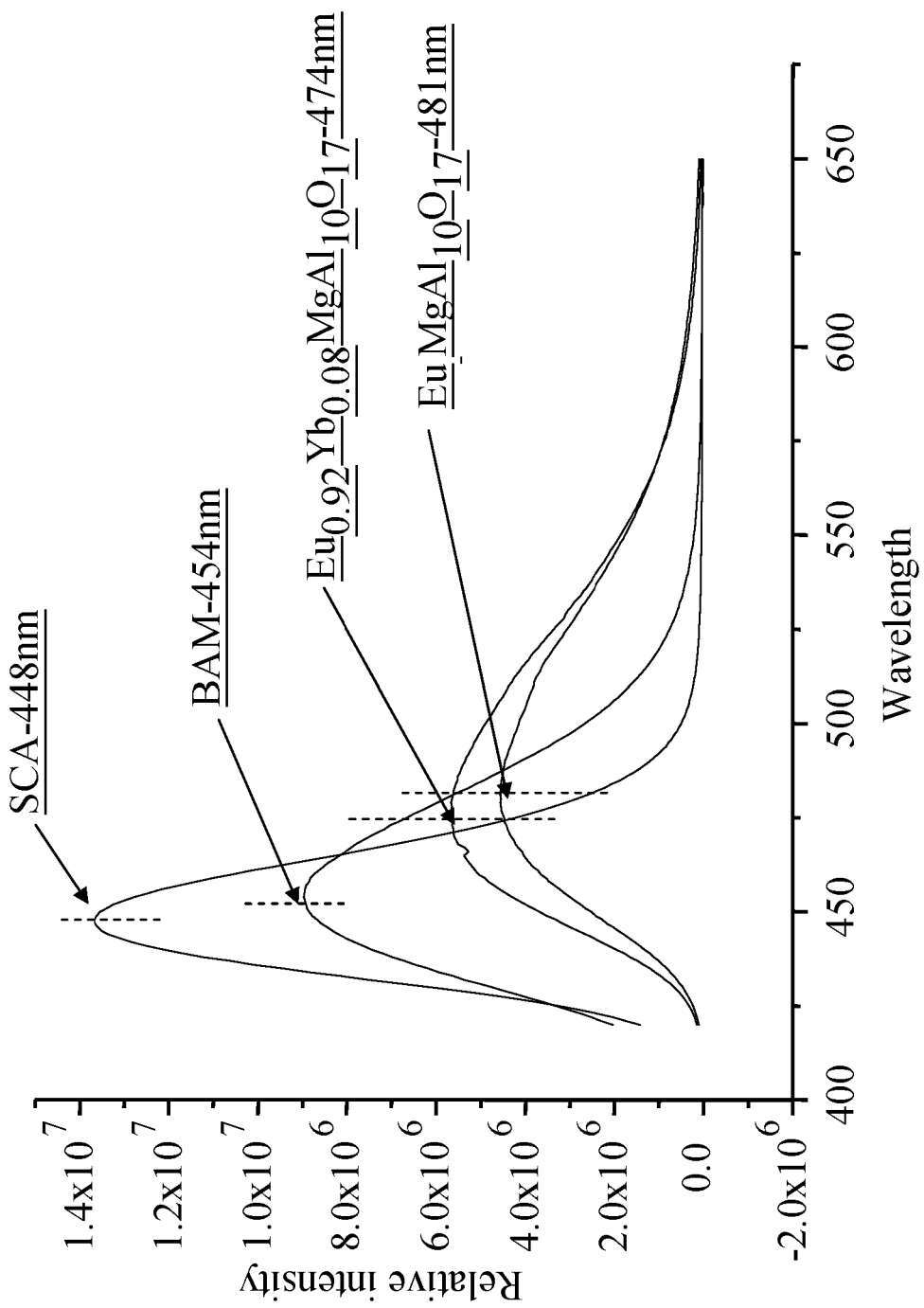
FIG. 4 shows a comparison of emission spectra between the phosphor $Eu_{0.92}Yb_{0.08}MgAl_{10}O_{17}$ in one embodiment of the invention, a conventional phosphor $EuMgAl_{10}O_{17}$, a commercially available product BAM, and a commercially available product SCA.

According to chemical stoichiometry, the appropriate amount of $Eu_2O_3$ (commercially available from Aldrich Chemicals Company Inc. in U.S.A., 99.99%, FW=351.92), $Yb_2O_3$ (commercially available from PRO CHEM Inc. in U.S.A., 99.9%, FW=394), MgO (commercially available from Aldrich Chemicals Company Inc. in U.S.A., 99.99%, FW=40.3), and $Al_2O_3$ (commercially available from Aldrich Chemicals Company Inc. in U.S.A., >99.9%, FW=101.96) were evenly mixed and grinded together, and then charged in a high temperature furnace. After sintering at 1600° C. for about 8 hours under 5% $H_2/N_2$, the phosphors $Eu_{0.98}Yb_{0.02}MgAl_{10}O_{17}$, $Eu_{0.92}Yb_{0.08}MgAl_{10}O_{17}$, $Eu_{0.84}Yb_{0.16}MgAl_{10}O_{17}$ were prepared. An excitation and emission spectra comparison of the above products and a conventional phosphor $EuMgAl_{10}O_{17}$ is shown in FIG. 2. As shown, the phosphor $Eu_{0.92}Yb_{0.08}MgAl_{10}O_{17}$ had a major excitation peak of 396 nm and a major emission peak of 474 nm, wherein the major emission peak had a CIE coordinate of (0.172, 0.297). The influence of the Yb content ratio (x) to the photoluminescence intensity of the phosphors is described as below, in comparison to the conventional phosphor $EuMgAl_{10}O_{17}$ without a dopant. The photoluminescence intensity was enhanced by increasing the $Yb^{2+}$ ratio until x was equal to 0.08. When $Yb^{2+}$ ratio was greater than 0.08, the photoluminescence intensity of the phosphors was reduced by increasing the $Yb^{2+}$ ratio. Note that the phosphors corresponding to FIG. 2 was prepared at 1600° C. for 8 hours. The best Yb ratio (x) of the other phosphor $Eu_{1-x}Yb_xMgAl_{10}O_{17}$ was determined by sintering temperature and period, and was not limited by the best ratio of FIG. 2. The external quantum efficiencies of the phosphor $Eu_{0.92}Yb_{0.08}MgAl_{10}O_{17}$, a commercially available product BAM ($BaMgAl_{10}O_{17}$:$Eu^{2+}$), and a commercially available product SCA ($Ca_5(PO_4)_3Cl$:$Eu^{2+}$) are tabulated in Table 1. The CIE coordinates of the phosphor $Eu_{0.92}Yb_{0.08}MgAl_{10}O_{17}$, a commercially available product BAM, and a commercially available product SCA are shown in FIG. 3. The comparison of emission spectra between the phosphor $Eu_{0.92}Yb_{0.08}MgAl_{10}O_{17}$, the conventional phosphor $EuMgAl_{10}O_{17}$, a commercially available product BAM, and a commercially available product SCA is shown in FIG. 4.

TABLE 1

|  | $Eu_{0.92}Yb_{0.08}MgAl_{10}O_{17}$ | BAM | SCA |
| --- | --- | --- | --- |
| Absorption ratio (A, %) | 84 | 53.4 | 61.8 |
| Quantum efficiency (QE, %) | 60 | 89.2 | 91 |
| External quantum efficiency (A * QE, %) | 50.4 | 47.63 | 52.64 |

As shown in Table 1, the phosphor $Eu_{0.92}Yb_{0.08}MgAl_{10}O_{17}$ had higher external quantum efficiency than BAM, but lower external quantum efficiency than SCA. As shown in FIG. 4, the SCA had an emission peak of 448 nm with a poor luminous efficiency. In addition, SCA and BAM had narrower emission bands than the phosphor $Eu_{0.92}Yb_{0.08}MgAl_{10}O_{17}$, such that the phosphor $Eu_{0.92}Yb_{0.08}MgAl_{10}O_{17}$ with wider emission band had better color rendering than SCA and BAM.

Example 2

Figure 5:
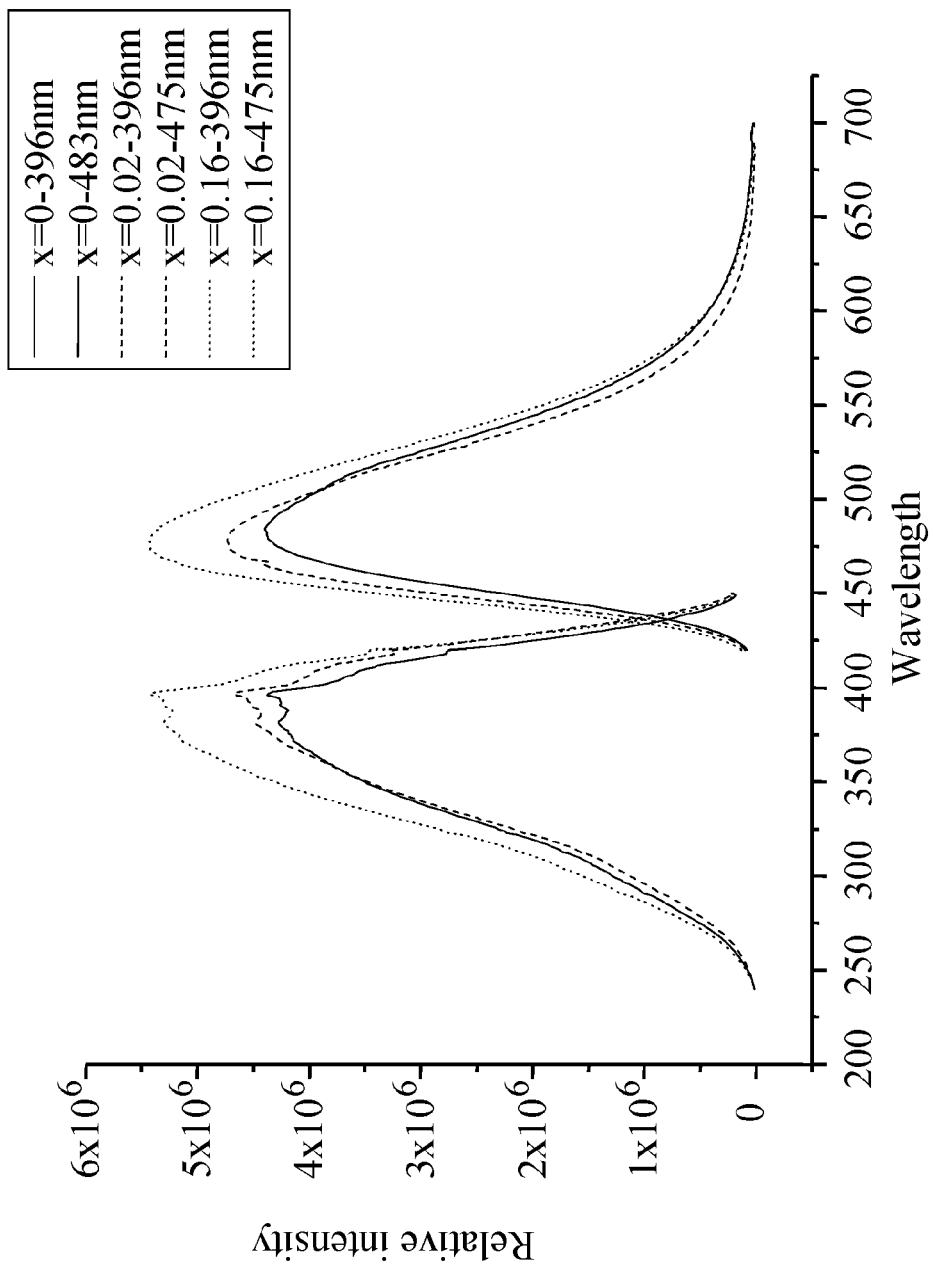
FIG. 5 shows a comparison of an excitation and emission spectra between the phosphors $Eu_{1-x}Dy_xMgAl_{10}O_{17}$ with different x ratios in one embodiment of the invention and a conventional phosphor $EuMgAl_{10}O_{17}$.

According to chemical stoichiometry, the appropriate amount of $Eu_2O_3$ (commercially available from Aldrich Chemicals Company Inc. in U.S.A., 99.99%, FW=351.92), $Dy_2O_3$ (commercially available from Aldrich Chemicals Company Inc. in U.S.A., >99.99%, FW=373.00), MgO (commercially available from Aldrich Chemicals Company Inc. in U.S.A., 99.99%, FW=40.3), and $Al_2O_3$ (commercially available from Aldrich Chemicals Company Inc. in U.S.A., >99.9%, FW=101.96) were evenly mixed and grinded, and then charged in a high temperature furnace. After sintering at 1600° C. for about 8 hours under 5% $H_2/N_2$, the phosphors $Eu_{0.98}Dy_{0.02}MgAl_{10}O_{17}$ and $Eu_{0.84}Dy_{0.16}MgAl_{10}O_{17}$ were prepared. An excitation and emission spectra comparison of the above products and a conventional phosphor $EuMgAl_{10}O_{17}$ is shown in FIG. 5. The phosphor $Eu_{0.84}Dy_{0.16}MgAl_{10}O_{17}$ had a major excitation peak of 396 nm and a major emission peak of 475 nm, wherein the major emission peak had a CIE coordinate of (0.176, 0.305). As shown in FIG. 5, the excitation efficiency and the emission intensity of the phosphor can be enhanced by doping a small amount of Dy.

Example 3

Figure 6:
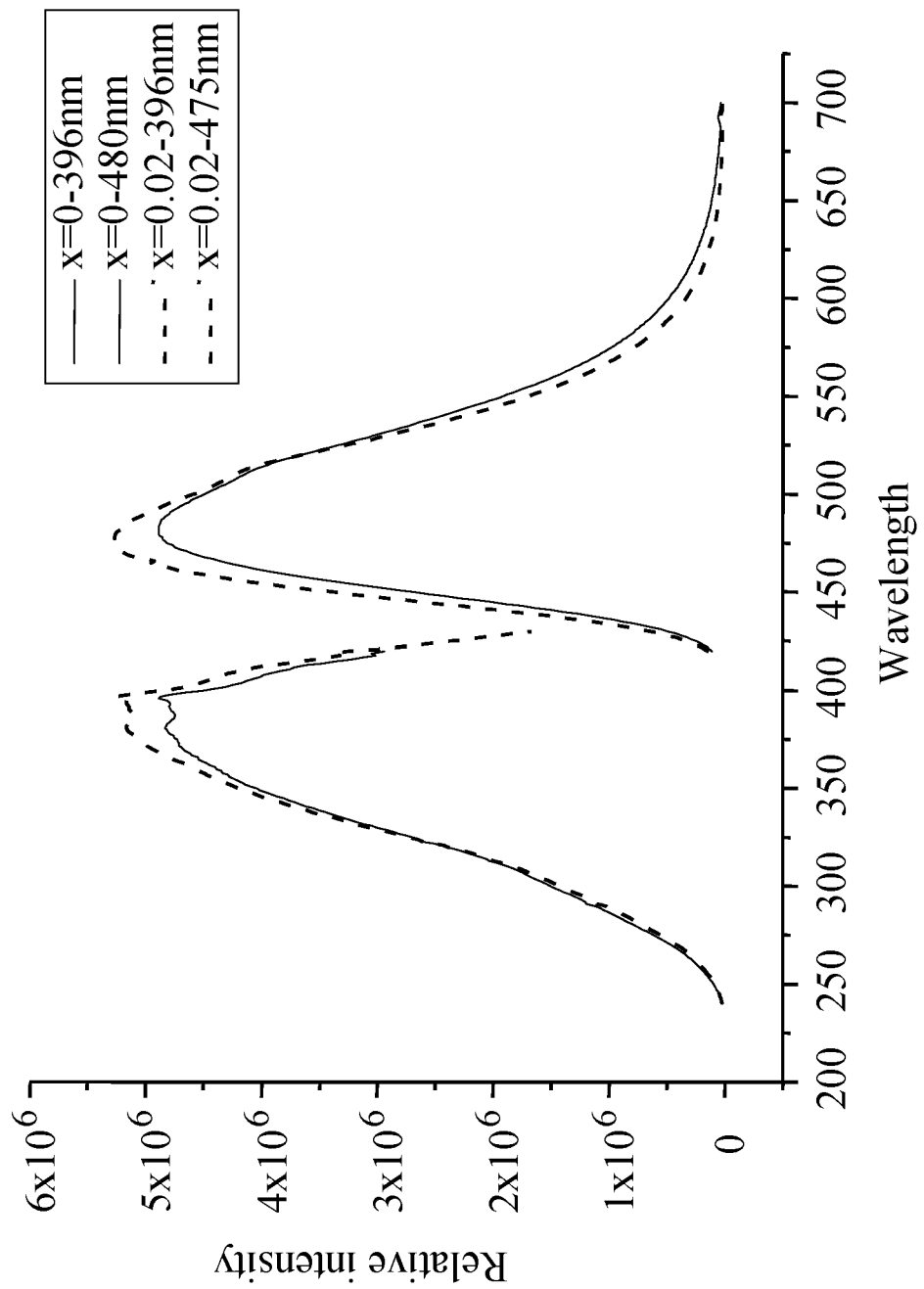
FIG. 6 shows a comparison of an excitation and emission spectra between the phosphor $Eu_{0.98}Ce_{0.02}MgAl_{10}O_{17}$ in one embodiment of the invention and a conventional phosphor $EuMgAl_{10}O_{17}$.

According to chemical stoichiometry, the appropriate amount of $Eu_2O_3$ (commercially available from Aldrich Chemicals Company Inc. in U.S.A., 99.99%, FW=351.92), $CeO_2$ (commercially available from Aldrich Chemicals Company Inc. in U.S.A., >99.9%, FW=172.11), MgO (commercially available from Aldrich Chemicals Company Inc. in U.S.A., 99.99%, FW=40.3), and $Al_2O_3$ (commercially available from Aldrich Chemicals Company Inc. in U.S.A., >99.9%, FW=101.96) were evenly mixed and grinded, and then charged in a high temperature furnace. After sintering at 1600° C. for about 8 hours under 5% $H_2/N_2$, the phosphor $Eu_{0.98}Ce_{0.02}MgAl_{10}O_{17}$ was prepared. An excitation and emission spectra comparison of the above product and a conventional phosphor $EuMgAl_{10}O_{17}$ was shown in FIG. 6. The phosphor $Eu_{0.98}Ce_{0.02}MgAl_{10}O_{17}$ had a major excitation peak of 396 nm and a major emission peak of 475 nm, wherein the major emission peak had a CIE coordinate of (0.168, 0.298).

Example 4

Figure 7:
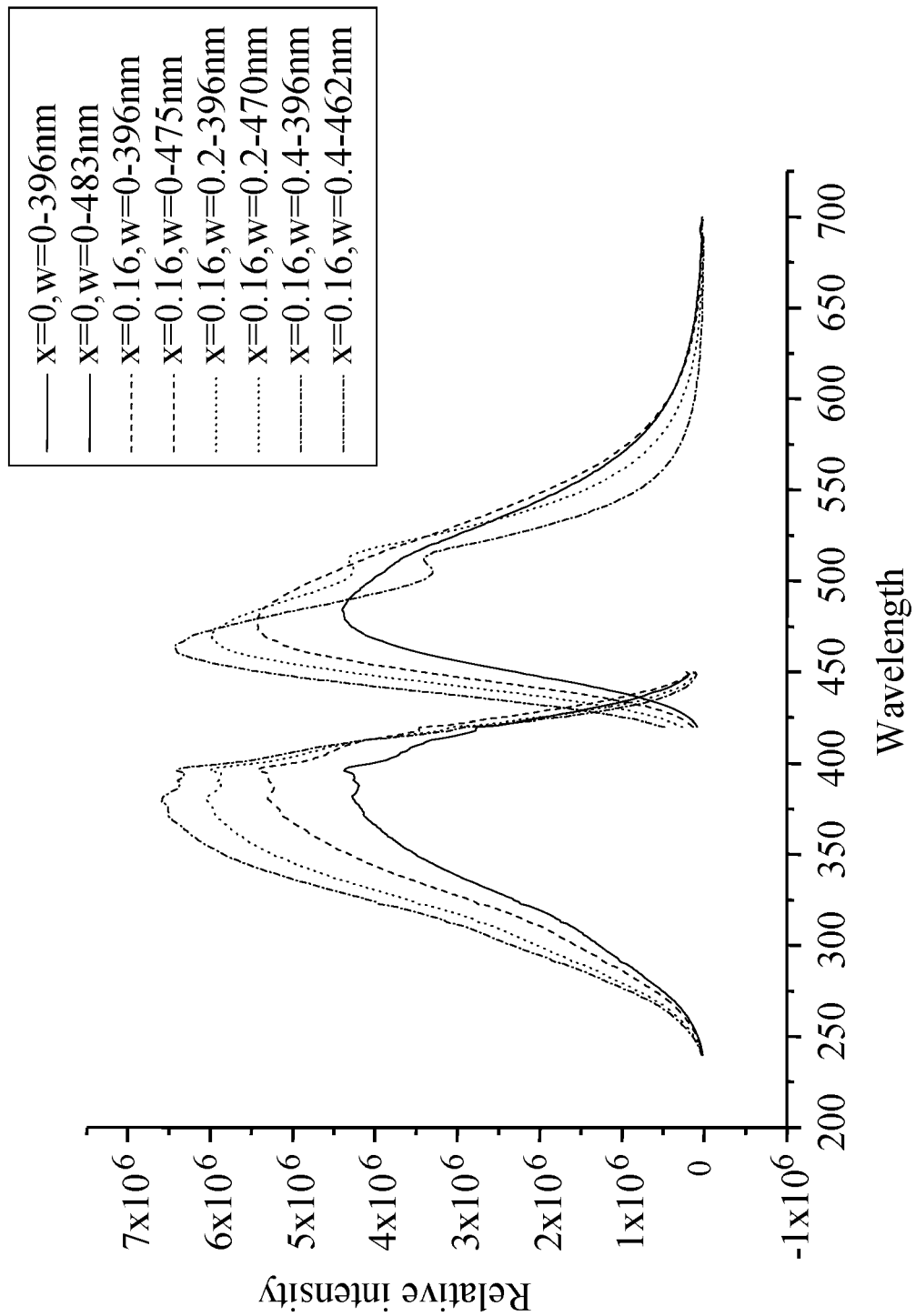
FIG. 7 shows a comparison of an excitation and emission spectra between phosphors $Eu_{1-x-y}Dy_xBa_wMgAl_{10}O_{17}$ with different x ratios and different w ratios in one embodiment of the invention.

According to chemical stoichiometry, the appropriate amount of $Eu_2O_3$ (commercially available from Aldrich Chemicals Company Inc. in U.S.A., 99.99%, FW=351.92), $BaCO_3$ (commercially available from PRO CHEM Inc. in U.S.A., 99.9%, FW=197.34), $Dy_2O_3$ (commercially available from Aldrich Chemicals Company Inc. in U.S.A., >99.99%, FW=373.00), MgO (commercially available from Aldrich Chemicals Company Inc. in U.S.A., 99.99%, FW=40.3), and $Al_2O_3$ (commercially available from Aldrich Chemicals Company Inc. in U.S.A., >99.9%, FW=101.96) were evenly mixed and grinded, and then charged in a high temperature furnace. After sintering at 1600° C. for about 8 hours under 5% $H_2/N_2$, the phosphors $Eu_{0.84}Dy_{0.16}MgAl_{10}O_{17}$, $Eu_{0.64}Ba_{0.2}Dy_{0.16}MgAl_{10}O_{17}$, and $Eu_{0.44}Ba_{0.4}Dy_{0.16}MgAl_{10}O_{17}$ were prepared. An excitation and emission spectra comparison of the above products was shown in FIG. 7. The phosphors had major excitation peaks of 370 nm to 396 nm and major emission peaks of 463 nm to 475 nm, wherein the major emission peaks had a CIE coordinates of (0.145, 0.189) to (0.158, 0.260). As described above, several dopants such as Ba and Dy could be doped in the phosphors to enhance the excitation efficiencies and emission intensities thereof.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A blue phosphor, having a formula:
   $Eu_{(1-x)}Yb_xMgAl_{10}O_{17}$, $Eu_{(1-x)}Dy_xMgAl_{10}O_{17}$, $Eu_{(1-x)}Ce_xMgAl_{10}O_{17}$, or $Eu_{(1-x-w)}Dy_xBa_wMgAl_{10}O_{17}$,
   wherein:
   $0<x<0.5$;
   $0\leq w\leq 0.5$.

2. The blue phosphor as claimed in claim 1 being excited by 200-400 nm UV or 400-420 nm blue light to emit a blue light, wherein the blue light has a major emission peak of 476 nm and a CIE coordinate of (0.172, 0.297).

3. A white light illumination device, comprising the blue phosphor as claimed in claim 1 and an excitation light source, wherein the excitation light source emits 200-400 nm UV or 400-420 nm blue light.

4. The white light illumination device as claimed in claim 3, further comprising a green phosphor and a red phosphor.

5. The white light illumination device as claimed in claim 3, further comprising a yellow phosphor.

6. A solar cell, comprising:
   a transparent substrate;
   an anode and a cathode on the bottom surface of the transparent substrate; and
   a semiconductor layer between the anode and the cathode, wherein the top surface of the transparent substrate has the blue phosphor as claimed in claim 1.

* * * * *